United States Patent
Ning et al.

(10) Patent No.: US 7,709,336 B2
(45) Date of Patent: May 4, 2010

(54) METAL HARD MASK METHOD AND STRUCTURE FOR STRAINED SILICON MOS TRANSISTORS

(75) Inventors: Xian J. Ning, Shanghai (CN); Hanming Wu, Shanghai (CN); John Chen, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 182 days.

(21) Appl. No.: 11/321,767

(22) Filed: Dec. 28, 2005

(65) Prior Publication Data

US 2006/0194395 A1    Aug. 31, 2006

(51) Int. Cl.
  *H01L 21/336* (2006.01)
(52) U.S. Cl. .............................. 438/300; 257/E21.619; 257/E21.634
(58) Field of Classification Search .................. 438/300; 257/E21.619, E21.634
  See application file for complete search history.

(56) References Cited

U.S. PATENT DOCUMENTS

| | | |
|---|---|---|
| 6,179,973 B1 | 1/2001 | Lai et al. |
| 6,251,242 B1 | 6/2001 | Fu et al. |
| 6,277,249 B1 | 8/2001 | Gopalraja et al. |
| 6,291,321 B1 | 9/2001 | Fitzgerald |
| 6,352,629 B1 | 3/2002 | Wang |
| 6,406,599 B1 | 6/2002 | Subramani et al. |
| 6,503,773 B2 | 1/2003 | Fitzgerald |
| 6,514,836 B2 | 2/2003 | Belford |
| 6,563,152 B2 | 5/2003 | Roberts et al. |
| 6,566,276 B2 * | 5/2003 | Maloney et al. ............. 438/758 |
| 6,730,196 B2 | 5/2004 | Wang et al. |
| 7,052,946 B2 * | 5/2006 | Chen et al. ................... 438/199 |
| 7,381,623 B1 * | 6/2008 | Chen et al. ................... 438/300 |
| 7,425,488 B2 * | 9/2008 | Wu et al. ..................... 438/285 |

(Continued)

FOREIGN PATENT DOCUMENTS

WO    WO 01/54175    7/2001

OTHER PUBLICATIONS

Belford et al., Performance-Augmented CMOS Using Back-end Uniaxial Strain, 2002 Device Research Conference, Santa Barbara, CA.

(Continued)

*Primary Examiner*—M. Wilczewski
(74) *Attorney, Agent, or Firm*—Townsend and Townsend and Crew LLP

(57) ABSTRACT

A semiconductor integrated circuit device. The device has a semiconductor substrate and a dielectric layer overlying the semiconductor substrate. The device also has a gate structure including edges. A metal hard mask layer is overlying the gate structure. A dielectric layer is formed sidewall spacers on the edges of the gate structure to protect the gate structure including the edges. An exposed portion of the metal hard mask layer is overlying the gate structure. A silicon germanium fill material is provided in an etched source region and an etched drain region. The etched source region and the etched drain region are each coupled to the gate structure. The device has a strained channel region between the filled source region and the filled drain region from at least the silicon germanium material formed in the etched source region and the etched drain region. An electrical connection is coupled to the metal hard mask overlying the gate structure. Optionally, the device has a second metal layer overlying the metal hard mask.

15 Claims, 5 Drawing Sheets

U.S. PATENT DOCUMENTS

| | | | | |
|---|---|---|---|---|
| 7,557,000 | B2* | 7/2009 | Chen et al. | 438/222 |
| 2005/0035409 | A1* | 2/2005 | Ko et al. | 257/350 |
| 2007/0072376 | A1* | 3/2007 | Chen et al. | 438/275 |
| 2007/0128786 | A1* | 6/2007 | Cheng et al. | 438/199 |
| 2009/0065805 | A1* | 3/2009 | Wu et al. | 257/190 |

OTHER PUBLICATIONS

Comita et al., Low Temperature Si and SiGe Epitaxy for sub 01.µm Technology, AMAT Conference Paper, Mar. 10, 2003.

Chuang et al., Design Considerations of SOI Digital CMOS VLSI, Proceedings 1998 IEEE International SOI Conference, Oct. 1998, pp. 5-8.

Ge et al., Process-Strained Si (PSS) CMOS Technology Featuring 3D Strain Engineering, IEEE International Electron Devices Meeting, Washington, DC, Dec. 2003.

Thompson, Strainied Silicon MOSFETs: The Next Material Change to Extend Moore's Law, University of Florida, Spring MRS 2004.

\* cited by examiner

METAL HARD MASK METHOD AND STRUCTURE FOR STRAINED SILICON MOS TRANSISTORS

CROSS-REFERENCES TO RELATED APPLICATIONS

This application claims priority to Chinese Application No. 200510023524.3; filed on Jan. 18, 2005; commonly assigned, and of which is hereby incorporated by reference for all purposes. This application also relates to U.S. Ser. No. 11/244,955, commonly assigned, and hereby incorporated by reference for all purposes.

BACKGROUND OF THE INVENTION

The present invention is directed to integrated circuits and their processing for the manufacture of semiconductor devices. More particularly, the invention provides a method and structures for manufacturing MOS devices using strained silicon structures for advanced CMOS integrated circuit devices. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of MOS devices itself. Such device has traditionally became smaller and smaller and produced faster switching speeds. Although there have been significant improvements, such device designs still have many limitations. As merely an example, these designs must become smaller and smaller but still provide clear signals for switching, which become more difficult as the device becomes smaller. Additionally, these designs are often difficult to manufacture and generally require complex manufacturing processes and structures. These and other limitations will be described in further detail throughout the present specification and more particularly below.

From the above, it is seen that an improved technique for processing semiconductor devices is desired.

BRIEF SUMMARY OF THE INVENTION

According to the present invention, techniques for processing integrated circuits for the manufacture of semiconductor devices are provided. More particularly, the invention provides a method and structures for manufacturing MOS devices using strained silicon structures for CMOS advanced integrated circuit devices. But it would be recognized that the invention has a much broader range of applicability.

In a specific embodiment, the present invention provides a method for forming a semiconductor integrated circuit device, e.g., CMOS, NMOS. The method includes providing a semiconductor substrate, e.g., silicon wafer, silicon on insulator. The method includes forming a dielectric layer (e.g., oxide, nitride, oxynitride) overlying the semiconductor substrate. The method includes forming a gate layer (e.g., polysilicon) overlying the dielectric layer. Preferably, the gate layer is overlying a channel region in the semiconductor substrate. The method includes forming a metal hard mask overlying the gate layer and patterning the gate layer, including the metal hard mask layer, to form a gate structure including edges. In a specific embodiment, the metal hard mask is made of a material selected from titanium (Ti), cobalt (Co), nickel (Ni), tungsten (W), tungsten silicide (WSi), and platinum (Pt), any combination of these, and the like. The method also includes forming a dielectric layer overlying the gate structure and hard mask layer to protect the gate structure including the edges. The method patterns the dielectric layer to form sidewall spacer structures on the gate structure, including the edges, and exposes a portion of the metal hard mask layer. The method includes etching a source region and a drain region adjacent to the gate structure using the dielectric layer and portion of the metal hard mask layer as a protective layer and depositing silicon germanium material into the source region and the drain region to fill the etched source region and the etched drain region. Preferably, the method maintains the gate structure free from any silicon germanium residues using the sidewall spacers and hard mask structures according to a specific embodiment. The method includes causing a channel region between the source region and the drain region to be strained in compressive mode from at least the silicon germanium material formed in the source region and the drain region.

In an alternative specific embodiment, the present invention provides a method for forming a semiconductor integrated circuit device, e.g., CMOS, NMOS. The method includes providing a semiconductor substrate, e.g., silicon wafer, silicon on insulator. The method includes forming a dielectric layer (e.g., oxide, nitride, oxynitride) overlying the semiconductor substrate. The method includes forming a gate layer (e.g., polysilicon) overlying the dielectric layer. Preferably, the gate layer is overlying a channel region in the semiconductor substrate. The method includes forming a metal hard mask overlying the gate layer and patterning the gate layer, including the metal hard mask layer, to form a gate structure including edges. The method also includes forming a dielectric layer overlying the gate structure and hard mask layer to protect the gate structure including the edges. The method patterns the dielectric layer to form sidewall spacer structures on the gate structure, including the edges, and exposes a portion of the metal hard mask layer. The method includes etching a source region and a drain region adjacent to the gate structure using the dielectric layer and portion of the metal hard mask layer as a protective layer and depositing silicon germanium material into the source region and the drain region to fill the etched source region and the etched drain region. Preferably, the method maintains the gate structure free from any silicon germanium residues using the sidewall spacers and hard mask structures according to a specific embodiment. The method includes causing a channel region between the source region and the drain region to be strained in compressive mode from at least the silicon germanium material formed in the source region and the drain region. The method also includes coupling the metal hard mask layer to an electrical connection to connect the gate structure to the electrical connection according to a preferred embodiment.

In yet an alternative specific embodiment, the present invention provides a semiconductor integrated circuit device. The device has a semiconductor substrate and a dielectric layer overlying the semiconductor substrate. The device also has a gate structure including edges. A metal hard mask layer is overlying the gate structure. A dielectric layer is formed sidewall spacers on the edges of the gate structure to protect the gate structure including the edges. An exposed portion of the metal hard mask layer is overlying the gate structure. A silicon germanium fill material is provided in an etched source region and an etched drain region. The etched source region and the etched drain region are each coupled to the gate structure. The device has a strained channel region between the filled source region and the filled drain region from at least the silicon germanium material formed in the etched source region and the etched drain region. An electrical connection is coupled to the metal hard mask overlying the gate structure. Optionally, the device has a second metal layer overlying the metal hard mask.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved process integration for design rules of 90 nanometers and less. Additionally, the invention provides for increased mobility of holes using a strained silicon structure for CMOS devices. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques for processing integrated circuits for the manufacture of semiconductor devices are provided. More particularly, the invention provides a method and structures for manufacturing MOS devices using strained silicon structures for CMOS advanced integrated circuit devices. But it would be recognized that the invention has a much broader range of applicability.

Figure 1:
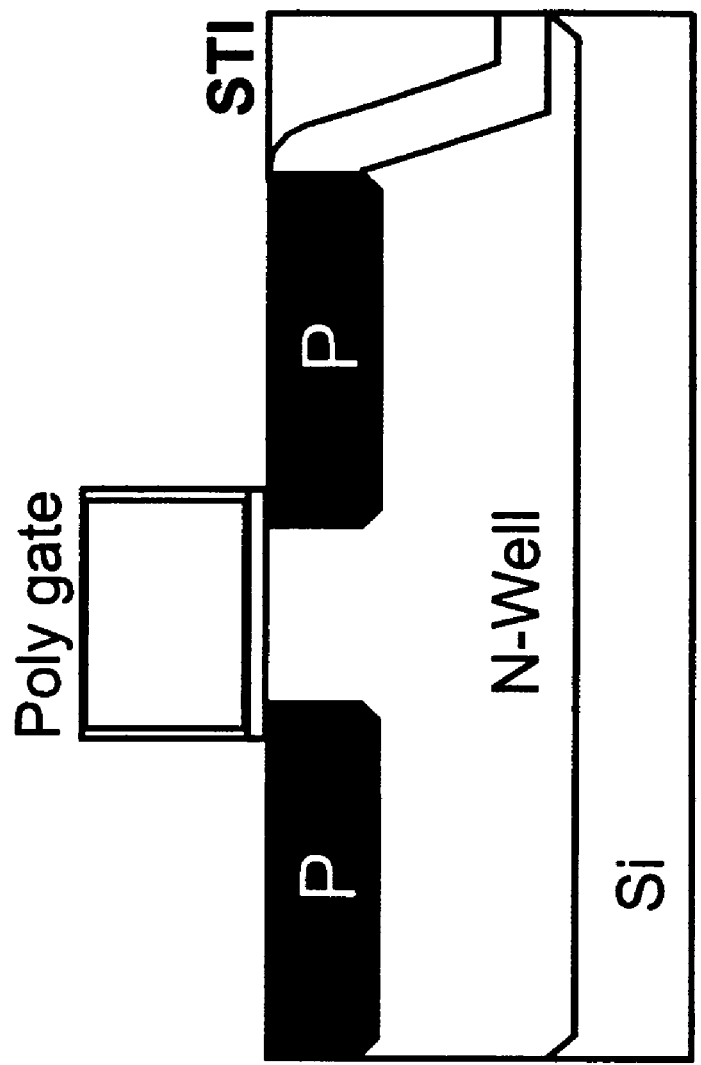
FIGS. 1 through 3 are simplified cross-sectional view diagram of a conventional method for fabricating a strained silicon MOS device.
Figure 2:
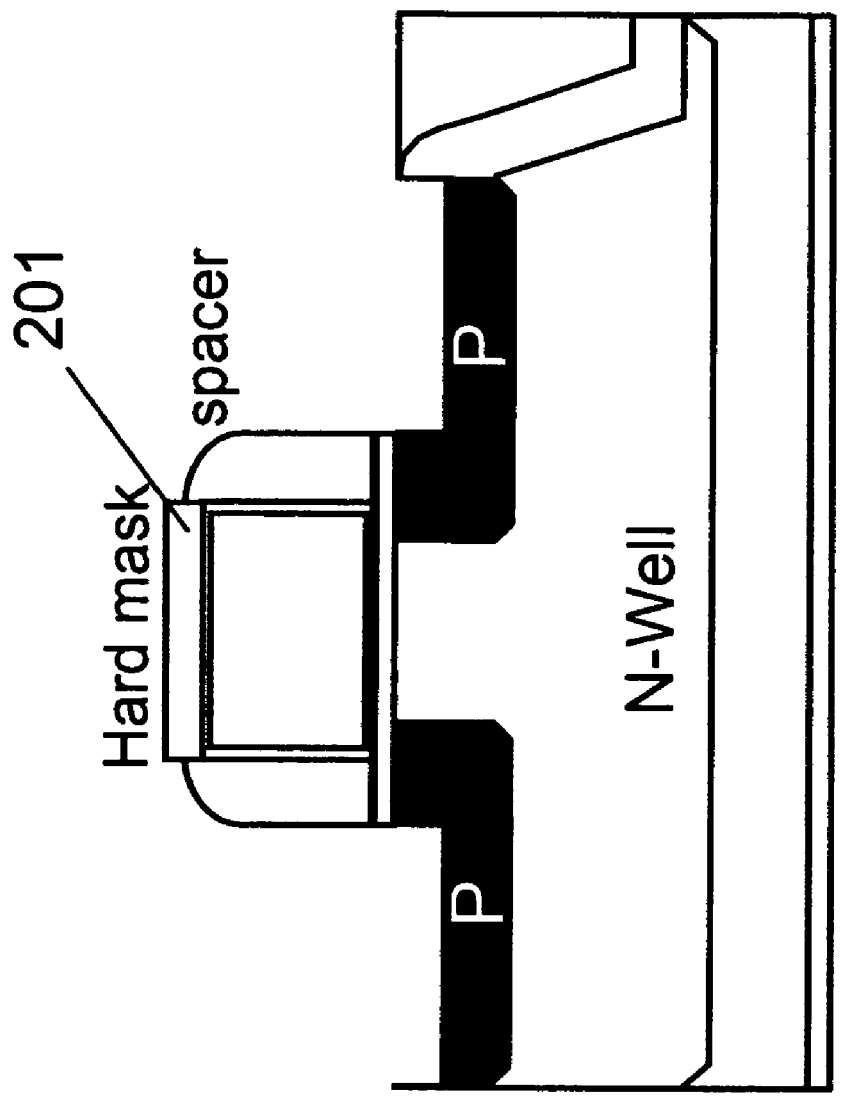
Figure 3:
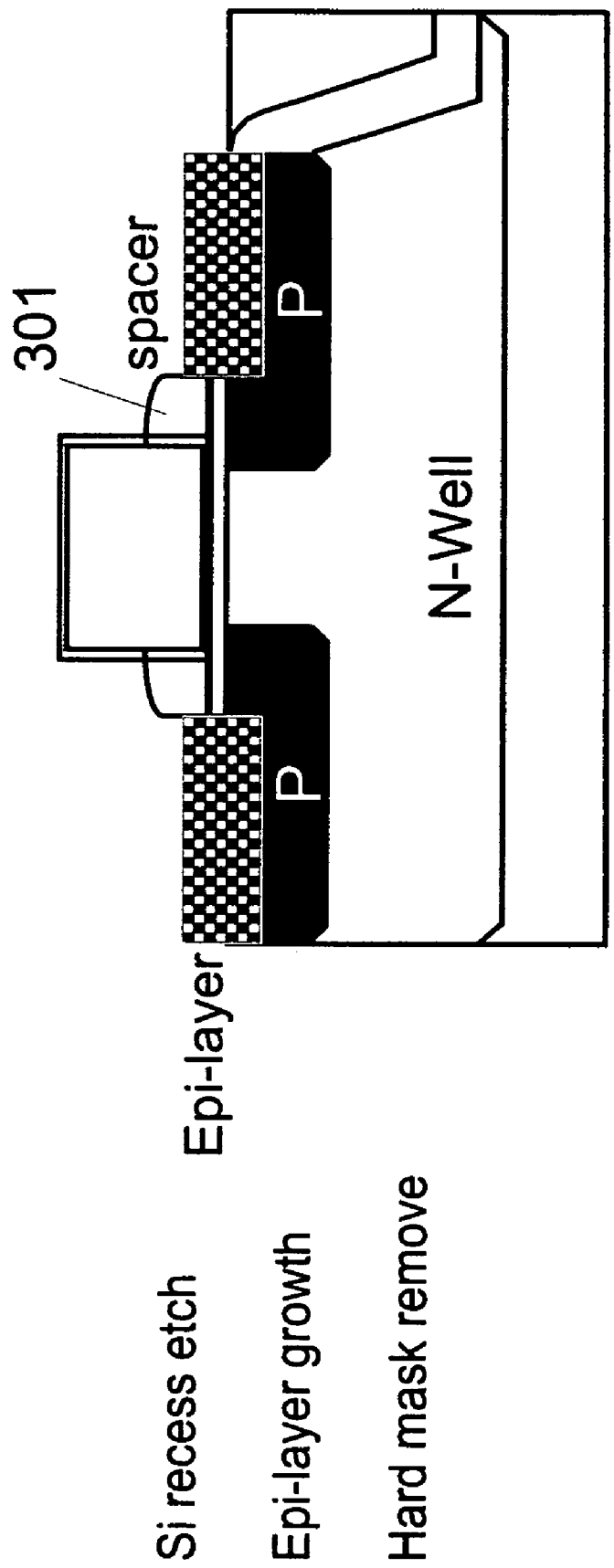

FIGS. 1 through 3 are simplified cross-sectional view diagram of conventional methods for fabricating a strained silicon MOS device. Referring to FIG. 1, a conventional process sequence has been reproduced below.
1. Provide a silicon substrate;
2. Form gate layer;
3. Form dielectric hard mask;
4. Pattern dielectric mask;
5. Pattern gate layer to form polysilicon gates;
6. Remove hard mask;
7. Deposit spacer layer and etch back; and
8. Perform other steps as desired.

Referring now to FIGS. 2 and 3, an alternative conventional process sequence has been reproduced below.
1. Provide a silicon substrate;
2. Form gate layer;
3. Form dielectric hard mask;
4. Pattern dielectric mask;
5. Pattern gate layer to form polysilicon gates;
6. Deposit spacer layer and etch back;
7. Etch source/drain recessed regions in silicon;
8. Form epitaxial silicon/germanium in recessed regions;
9. Remove hard mask; and
10. Perform other steps as desired.

As shown, the hard mask 201 degrades during etching of the recessed regions. Additionally, the spacers 301 also degrade during the etching of the recessed regions. After formation of the source/drain regions, the hardmask must often be removed for subsequent contact formation. Limitations exist with the conventional hard mask. Added resistivity may exist from any remaining dielectric residues on the gate layer. Additionally, residual silicon/germanium may deposit on any exposed surfaces of the gate layer, depending upon the quality of the hard mask. These and other limitations may be overcome by the present method and structures, which will be described in more detail below.

Figure 4:
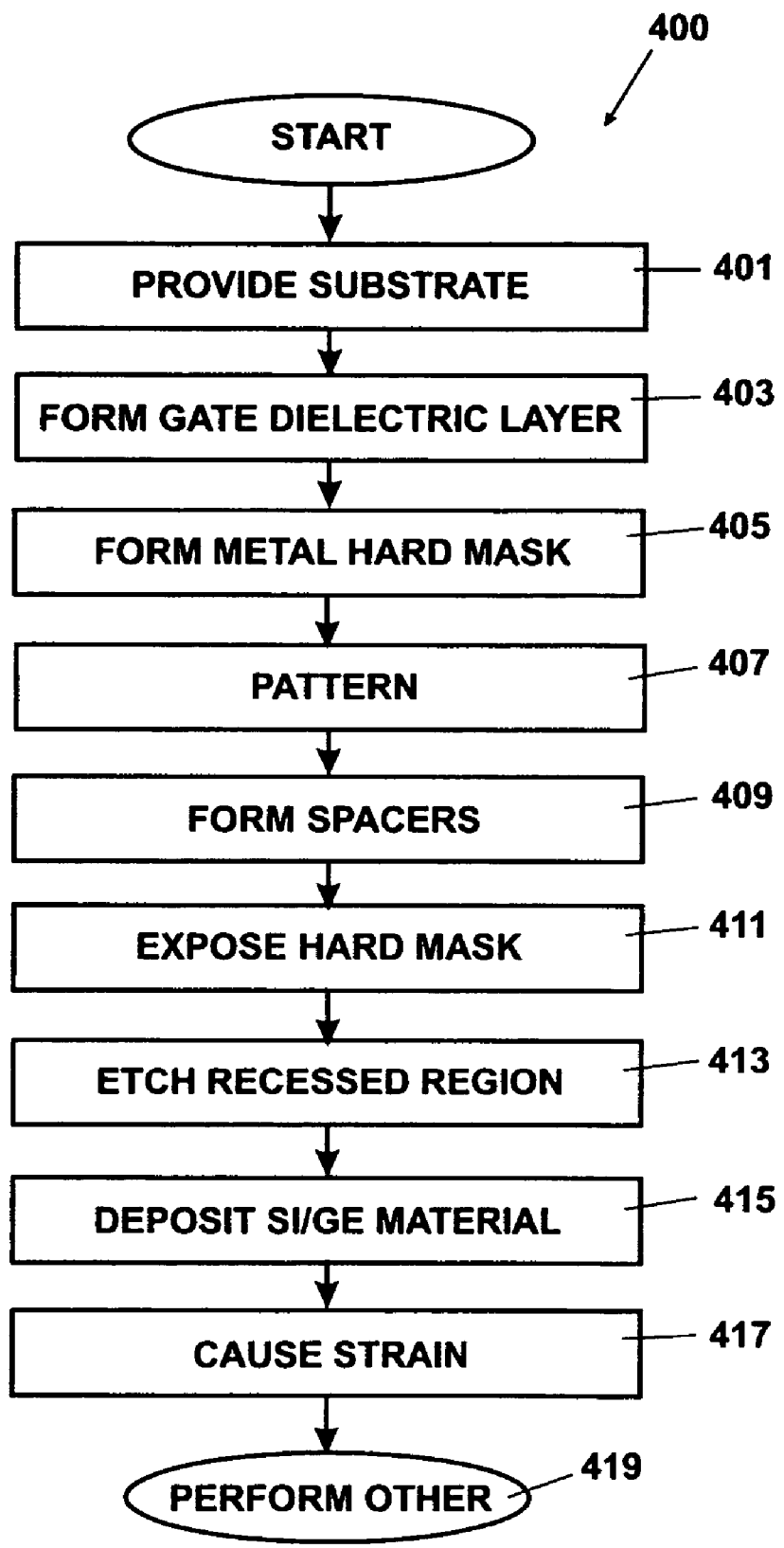
FIG. 4 is a simplified flow diagram illustrating a method for forming a strained silicon device using a metal hard mask according to an embodiment of the present invention.

A method 400 for fabricating an integrated circuit device according to an embodiment of the present invention may be outlined as follows (see FIG. 4):
1. Provide a semiconductor substrate (step 401), e.g., silicon wafer, silicon on insulator;
2. Form a dielectric layer (e.g., gate oxide or nitride) overlying the semiconductor substrate;
3. Form a gate layer (step 403) (e.g., polysilicon, metal) overlying the dielectric layer;
4. Form a metal hard mask layer (step 405) overlying the dielectric layer;
5. Pattern the gate layer (step 407), including the metal hard mask layer, to form a gate structure including edges (e.g., a plurality of sides or edges);
6. Form a dielectric layer overlying the gate structure to protect the gate structure including the edges;
7. Pattern the dielectric layer to form sidewall spacers (step 409) on edges of the gate structure;
8. Optionally, expose (step 411) a portion of the metal hard mask layer during the pattern of the dielectric layer;
9. Etch the source region and the drain region (step 413) adjacent to the gate structure using the dielectric layer and metal hard mask as the protective layer;
10. Deposit silicon germanium material (step 415) into the source region and the drain region to fill the etched source region and the etched drain region;
11. Cause a channel region between the source region and the drain region to be strained (step 417) in compressive mode from at least the silicon germanium material formed in the source region and the drain region, wherein the channel region is about the same width as the patterned gate layer; and
12. Perform other steps (step 419), as desired.

The above sequence of steps provides a method according to an embodiment of the present invention. As shown, the method uses a combination of steps including a way of forming an integrated circuit device such as an N-type channel device for a CMOS integrated circuit. As shown, the method includes using a metal hard mask as a protective layer for forming the etched source/drain regions. Other alternatives can also be provided where steps are added, one or more steps are removed, or one or more steps are provided in a different sequence without departing from the scope of the claims herein. Further details of the present method can be found throughout the present specification and more particularly below.

A method for fabricating a CMOS integrated circuit device according to an alternative embodiment of the present invention may be outlined as follows:

1. Provide a semiconductor substrate, e.g., silicon wafer, silicon on insulator;
2. Form a gate dielectric layer overlying the surface of the substrate;
3. Form a gate layer overlying the semiconductor substrate;
4. Form a metal hard mask layer overlying the gate layer;
5. Pattern the gate layer, including the hard mask layer, to form an NMOS gate structure including edges and a PMOS gate structure including edges;
6. Form a dielectric layer overlying the NMOS gate structure to protect the NMOS gate structure including the edges and overlying the PMOS gate structure to protect the PMOS gate structure including the edges;
7. Form sidewall spacers on edges of the gate structures from the dielectric layer;
8. Optionally, expose a portion of the metal hard mask layer on the gate structures;
9. Simultaneously etch a first source region and a first drain region adjacent to the NMOS gate structure and etch a second source region and a second drain region adjacent to the PMOS gate structure using the dielectric layer and exposed portion of the hard mask layer as a protective layer;
10. Pretreat etched source/drain regions;
11. Mask NMOS regions;
12. Deposit silicon germanium material into the first source region and the first drain region to cause a channel region between the first source region and the first drain region of the PMOS gate structure to be strained in a compressive mode;
13. Strip Mask from NMOS regions;
14. Mask PMOS regions;
15. Deposit silicon carbide material into the second source region and second drain region to cause the channel region between the second source region and the second drain region of the NMOS gate structure to be strained in a tensile mode;
16. Perform other steps, as desired.

The above sequence of steps provides a method according to an embodiment of the present invention. As shown, the method uses a combination of steps including a way of forming a CMOS integrated circuit device. As shown, the method includes using a metal hard mask as a protective layer for forming the etched source/drain regions. Other alternatives can also be provided where steps are added, one or more steps are removed, or one or more steps are provided in a different sequence without departing from the scope of the claims herein. Further details of the present device can be found throughout the present specification and more particularly below.

Figure 5:
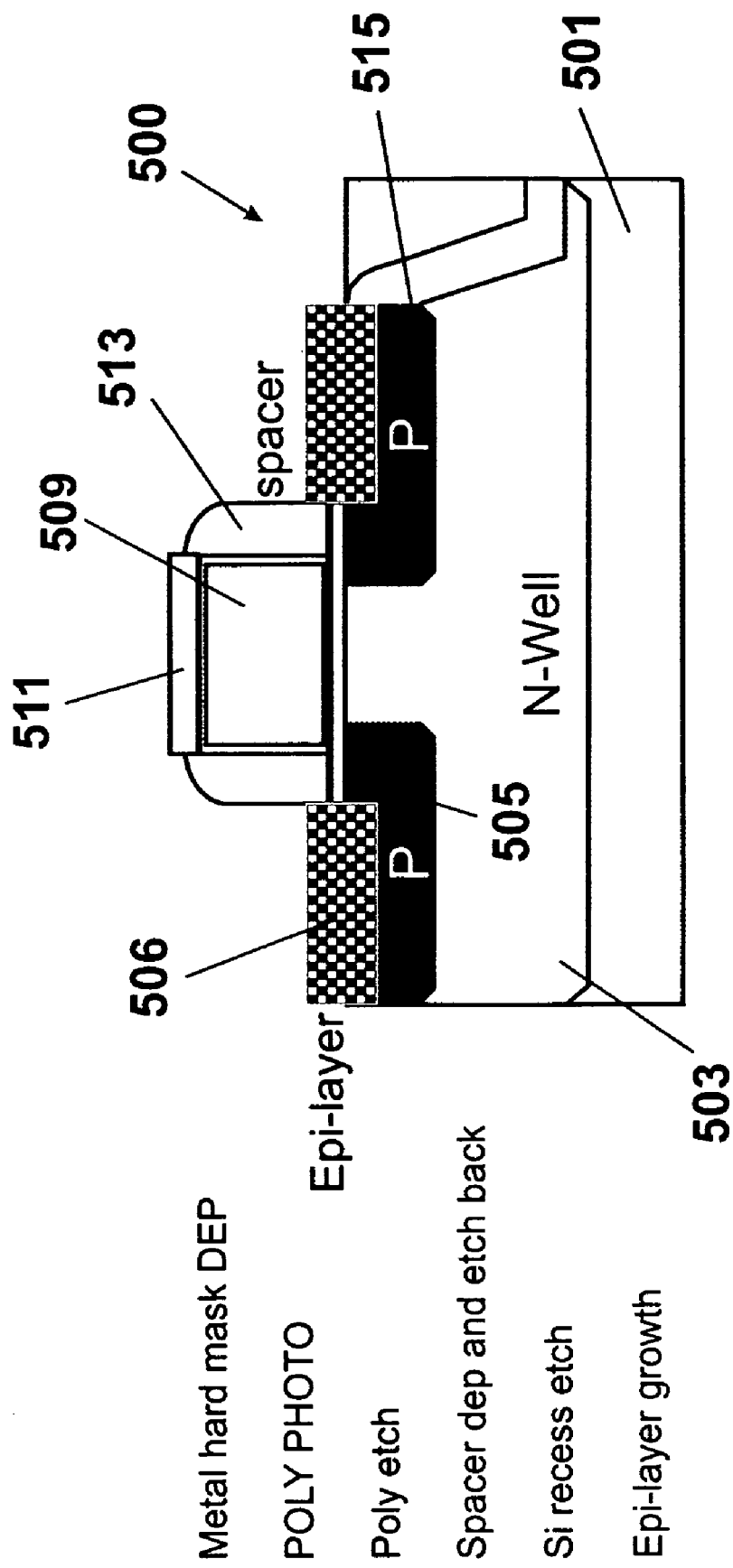
FIG. 5 is a simplified cross-sectional view diagram of a strained silicon device using a metal hard mask according to an embodiment of the present invention.

FIG. 5 is a simplified cross-sectional view diagram of a strained silicon MOS device 500 according to an embodiment of the present invention. This diagrams are merely examples, which should not unduly limit the scope of the claims herein. One of ordinary skill in the art would recognize many variations, alternatives, and modifications. As shown, the present invention provides a semiconductor integrated circuit device. The device has a semiconductor substrate 501, e.g., silicon wafer, silicon on insulator wafer. The device has a dielectric layer overlying the semiconductor substrate. Preferably, the dielectric acts as a gate dielectric layer and is made of silicon dioxide, silicon nitride, or silicon oxynitride depending upon the specific embodiment. The device is formed in well region 503, which is an N-type well. Other wells may be P-type to form CMOS devices. The device also has a gate structure 509 including edges. The gate structure is often made of a polysilicon material that is doped with impurities. The polysilicon material can be in-situ doped using boron type impurities or others. The gate structure can be a single layer or multiple layers depending upon the embodiment.

In a preferred embodiment, a metal hard mask layer 511 is overlying the gate structure. In a specific embodiment, the metal hard mask is formed from a metal consisting of titanium (Ti), cobalt (Co), nickel (Ni), tungsten (W), tungsten silicide (WSi), and platinum (Pt), or any suitable combination of these, and other suitable materials. In a specific embodiment, the hard mask has a thickness of metal material having a thickness of about 200 to about 400 Angstroms, which is suitable for fabrication of devices having a channel length of 65 nanometers and less. In a preferred embodiment, the metal hard mask has an etching selectivity to silicon greater of 1:100 and is also silicided to the gate structure according to certain embodiments. Depending upon the embodiment, the metal hard mask preferably remains on the gate structure after the deposition process, which will be described in greater detail below.

In a specific embodiment, a dielectric layer forms sidewall spacers 513 on the edges of the gate structure to protect the gate structure including the edges. The dielectric layer can be an oxide, a nitride, or other suitable materials of sufficient thickness. The dielectric layer is also substantially pinhole free according to preferred embodiments. The dielectric layer is preferably less than 300 Angstroms in preferred embodiments. As shown, the device also has an exposed portion of the metal hard mask layer overlying the gate structure.

In a specific embodiment, a silicon germanium fill material 506 is provided in an etched source region and an etched drain region. The silicon germanium fill material is single crystalline and deposited using an epitaxial reactor. The ratio of silicon/germanium is 10% to 20% according to a specific embodiment. The etched source region and the etched drain region are each coupled to the gate structure. The device has a strained channel region between the filled source region and the filled drain region from at least the silicon germanium material formed in the etched source region and the etched drain region. The device also has lightly doped drain regions or implant regions 505, which are formed before growing the silicon/germanium material in the recessed regions. An electrical connection is coupled to the metal hard mask overlying the gate structure. Optionally, the device has a second metal layer overlying the metal hard mask. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming a semiconductor integrated circuit device comprising:
   providing a semiconductor substrate;
   forming a gate dielectric layer overlying the semiconductor substrate;
   forming a gate layer overlying the gate dielectric layer, the gate layer being overlying a channel region in the semiconductor substrate;
   forming a metal hard mask overlying the gate layer;
   patterning the gate layer, including the metal hard mask layer, to form a gate structure including edges;
   forming only a single dielectric layer overlying the gate structure and the metal hard mask layer to protect the gate structure including the edges;
   patterning the dielectric layer to form single-layer sidewall spacer structures on the gate structure, including the edges, while exposing a portion of the metal hard mask layer;

etching a source region and a drain region adjacent to the gate structure using the dielectric layer and portion of the metal hard mask layer as a protective layer;

depositing silicon germanium material into the source region and the drain region to fill the etched source region and the etched drain region;

maintaining the gate structure free from any silicon germanium residues;

causing a channel region between the source region and the drain region to be strained in compressive mode from at least the silicon germanium material formed in the source region and the drain region; and forming a contact structure on the metal hard mask, the metal hard mask being in physical and electrical contact with the gate structure.

2. The method of claim 1 wherein the hard mask is a thickness of metal material having a thickness of about 200 to about 400 Angstroms.

3. The method of claim 1 wherein the metal hard mask has an etching selectivity to silicon greater of 1:100.

4. The method of claim 1 wherein the metal hard mask is formed form a metal consisting of titanium (Ti), cobalt (Co), nickel (Ni), tungsten (W), tungsten silicide (WSi), and platinum (Pt).

5. The method of claim 1 wherein the metal hard mask has a thickness of 200 to 400 Angstroms.

6. The method of claim 1 wherein the metal hard mask is silicided to the gate structure.

7. The method of claim 1 wherein the metal hard mask remains on the gate structure after the deposition process.

8. The method of claim 1 further comprising forming a second metal layer overlying the metal hard mask layer, the second metal layer being selectively formed overlying the hard mask layer.

9. A method for forming a semiconductor integrated circuit device comprising:

providing a semiconductor substrate;

forming a gate dielectric layer overlying the semiconductor substrate;

forming a gate layer overlying the gate dielectric layer, the gate layer being overlying a channel region in the semiconductor substrate;

forming a metal hard mask overlying the gate layer;

patterning the gate layer, including the metal hard mask layer, to form a gate structure including edges;

forming only a single dielectric layer overlying the gate structure and the metal hard mask layer to protect the gate structure including the edges;

patterning the dielectric layer to form single-layer sidewall spacer structures on the gate structure, including the edges, while exposing a portion of the metal hard mask layer;

etching a source region and a drain region adjacent to the gate structure using the dielectric layer and portion of the metal hard mask layer as a protective layer;

depositing silicon germanium material into the source region and the drain region to fill the etched source region and the etched drain region;

maintaining the gate structure free from any silicon germanium residues;

causing a channel region between the source region and the drain region to be strained in compressive mode from at least the silicon germanium material formed in the source region and the drain region; and coupling the metal hard mask layer to form an electrical connection to the gate structure.

10. The method of claim 9 further comprising forming a second metal layer overlying the hard mask layer and siliciding the hard mask layer to the gate structure.

11. The method of claim 9 wherein the gate dielectric layer is less than 300 Angstroms.

12. The method of claim 9 wherein the channel region has a length of a width of the gate structure.

13. The method of claim 9 wherein the semiconductor substrate is essential silicon material.

14. The method of claim 9 wherein the silicon germanium material is single crystalline.

15. The method of claim 9 wherein the silicon germanium has a ratio of silicon/germanium of 10% to 20%.

* * * * *

UNITED STATES PATENT AND TRADEMARK OFFICE
CERTIFICATE OF CORRECTION

| | | |
|---|---|---|
| PATENT NO. | : 7,709,336 B2 | Page 1 of 1 |
| APPLICATION NO. | : 11/321767 | |
| DATED | : May 4, 2010 | |
| INVENTOR(S) | : Xian J. Ning, Hanming Wu and John Chen | |

It is certified that error appears in the above-identified patent and that said Letters Patent is hereby corrected as shown below:

Following foreign application priority data after item (63) in the cover page item

(30)  Foreign Application Priority Data  should read as follows:

Jan 18, 2005   (CN)                2005 1 0023524

Signed and Sealed this

Seventh Day of December, 2010

David J. Kappos
*Director of the United States Patent and Trademark Office*